US008848479B2

(12) United States Patent
Ngu et al.

(10) Patent No.: US 8,848,479 B2
(45) Date of Patent: Sep. 30, 2014

(54) MULTIPLE WRITE DURING SIMULTANEOUS MEMORY ACCESS OF A MULTI-PORT MEMORY DEVICE

(75) Inventors: Hui H. Ngu, Penang Island (MY); Bruce Gieseke, San Jose, CA (US)

(73) Assignee: eASIC Corporation, Santa Clara, CA (US)

( * ) Notice: Subject to any disclaimer, the term of this patent is extended or adjusted under 35 U.S.C. 154(b) by 660 days.

(21) Appl. No.: 13/070,894

(22) Filed: Mar. 24, 2011

(65) Prior Publication Data

US 2012/0243285 A1    Sep. 27, 2012

(51) Int. Cl.
*G11C 8/00* (2006.01)
*G11C 8/16* (2006.01)
*G11C 11/412* (2006.01)
*G11C 11/413* (2006.01)

(52) U.S. Cl.
CPC ............... *G11C 11/412* (2013.01); *G11C 8/16* (2013.01); *G11C 11/413* (2013.01)
USPC ................................ 365/230.05; 365/189.07

(58) Field of Classification Search
CPC ...... G11C 7/1006; G11C 7/062; G11C 7/1051; G11C 7/1075; G11C 7/12; G11C 7/14
USPC ......................................... 365/189.07, 230.03
See application file for complete search history.

(56) References Cited

U.S. PATENT DOCUMENTS 5,973,955 A * 10/1999 Nogle et al. .................. 365/154
2003/0086315 A1 * 5/2003 Mizuno et al. ................ 365/200

* cited by examiner

*Primary Examiner* — Hoai V Ho
(74) *Attorney, Agent, or Firm* — Panitch Schwarze Belisario & Nadel LLP

(57) ABSTRACT

A memory system may provide for a successful write of a multi-port memory cell (e.g., dual-port 2WR SRAM cell) when it is simultaneously accessed by more than one port. This multi-port memory cell may include at least two independent accesses to the memory cell, where each access may be controlled by an independent wordline signal. Each port may have an independent pair of bitlines. Multiple write circuitry (e.g., double write circuitry) may enable the write driver to drive the input data to more than one pair of bitlines simultaneously.

13 Claims, 15 Drawing Sheets

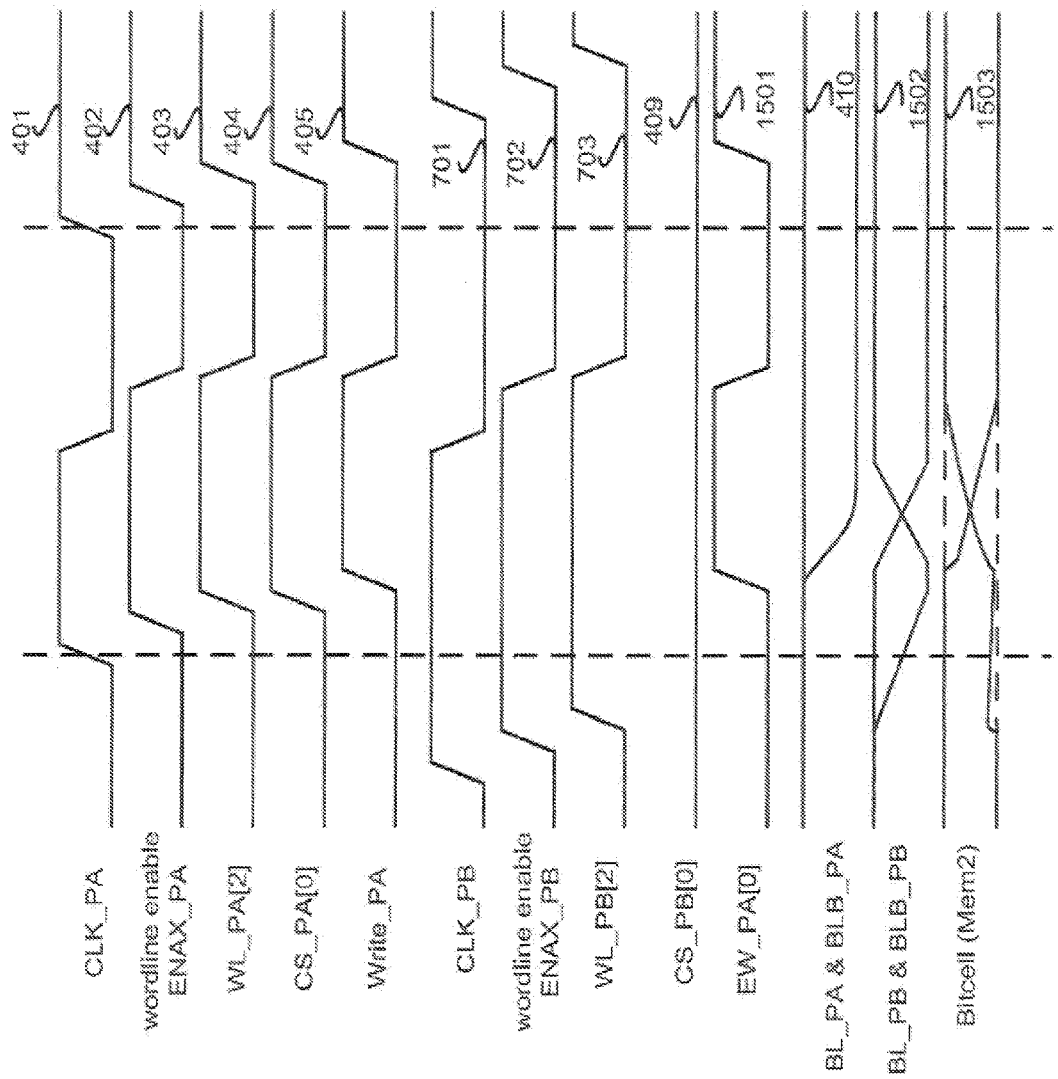

MULTIPLE WRITE DURING SIMULTANEOUS MEMORY ACCESS OF A MULTI-PORT MEMORY DEVICE

BACKGROUND OF THE INVENTION

In deep submicron technology, System-on-Chip (SoC) products may require a high-speed and low-power embedded memory to support increased storage capability. Typically, static random access memory (SRAM) has been widely used; more precisely a single-port SRAM, which allows one read or one write at a single clock cycle has generally been used. The field of SRAM devices has led to the development of a multi-port SRAM capable of performing multiple read and write operations in a single clock cycle.

A multi-port SRAM may greatly contribute to parallel operation and it is typically used as a buffer memory in multimedia applications or a data cache in a multi-core processor. The demand for multi-port SRAMs and other multi-port memory devices is increasing to accommodate high-speed communications and image processing. The capability to access the memory simultaneously can help to ease system speed bottlenecks and may directly improve system performance.

In general, one unit memory cell of a single-port SRAM device may be composed of six transistors, that is, two load transistors, two drive transistors, and two active transistors, to perform the read and write operations sequentially. In contrast, a multi-port SRAM device may be configured with additional active, transistors, beyond those of the general single-port SRAM, so as to support multiple simultaneous read and write operations. Such multiple access usage may lead to various difficulties. In a multiple access operation, for example, when a first port is used for a write operation and a second port is used for a read operation at the same time, they may interfere with each other to cause a characteristic drop in the SRAM cell. This may be observed, for example, during address contention, either full address contention or row address contention. Such interference may cause data errors, for example, an unsuccessful write operation.

SUMMARY OF EMBODIMENTS OF THE INVENTION

Embodiments of the present invention may relate to a design technique to provide a successful write during row address contention for both synchronous and asynchronous clock frequencies between ports. The proposed technique may be applicable to both synchronous clock phases and different clock phases between ports.

An embodiment of the invention may comprise a circuit that includes a memory array, wordlines, bitlines, read circuitry and write circuitry, which may be found as in a conventional memory design. However, in embodiments of the invention, the circuit may include an extra column select passgate at a strategic location and circuitry to control this extra column select, which may enable a write driver to drive input data to more than one pair of bitlines during simultaneous row access.

Accordingly, one may obtain a successful write operation during simultaneous row access in cases in which this may not be possible in a conventional memory circuit. Other features and advantages of the present invention will become apparent upon consideration of the following detailed description and the accompanying drawings.

BRIEF DESCRIPTION

Various embodiments of the invention will now be described in conjunction with the accompanying drawings, in which:

FIG. 15 illustrates waveforms demonstrating the relationships among various signals in accordance with operations described in connection with FIG. 13, during asynchronous clock operation.

DETAILED DESCRIPTION OF EMBODIMENTS OF THE INVENTION

While the following embodiments are described in conjunction with SRAM technology, the various techniques and circuitry described are not limited to use in SRAMs and, on the contrary, may be used in other types of memory structures. Additionally, while the embodiments described below focus on the dual-port case, the invention is not limited thereto and, on the contrary, may be applied to general multi-port memory systems.

Figure 1:
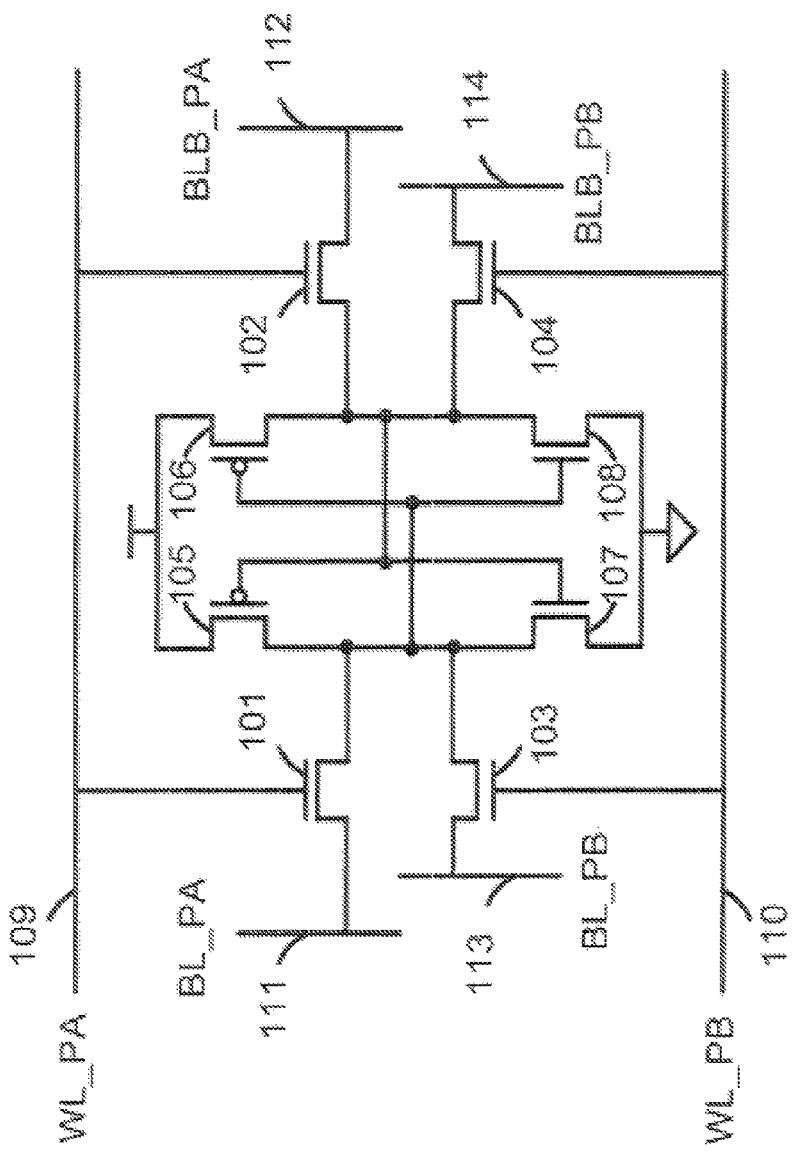
FIG. 1 is a circuit diagram illustrating a conventional dual-port SRAM cell.

FIG. 1 is a circuit diagram illustrating a conventional dual-port SRAM cell. A dual-port SRAM cell may include eight transistors 101-108, two sets of wordlines, WL_PA 109 and WL_PB 110, and four bitlines, BL_PA 111, BLB_PA 112, BL_PB 113, BLB_PB 114. BL_PA 111 and BLB_PA 112 may form one pair of bitlines, and BL_PB 113 and BLB_PB 114 may form another pair of bitlines. The first pen of the SRAM cell (Port A) may be accessed via wordline WL_PA 109, bitline BL_PA 111, and bitline BLB_PA 112. The second port of SRAM cell (Port B) may be accessed via wordline WL_PB 110, bitline BL_PB 113, and bitline BLB_PB 114.

Figure 2:
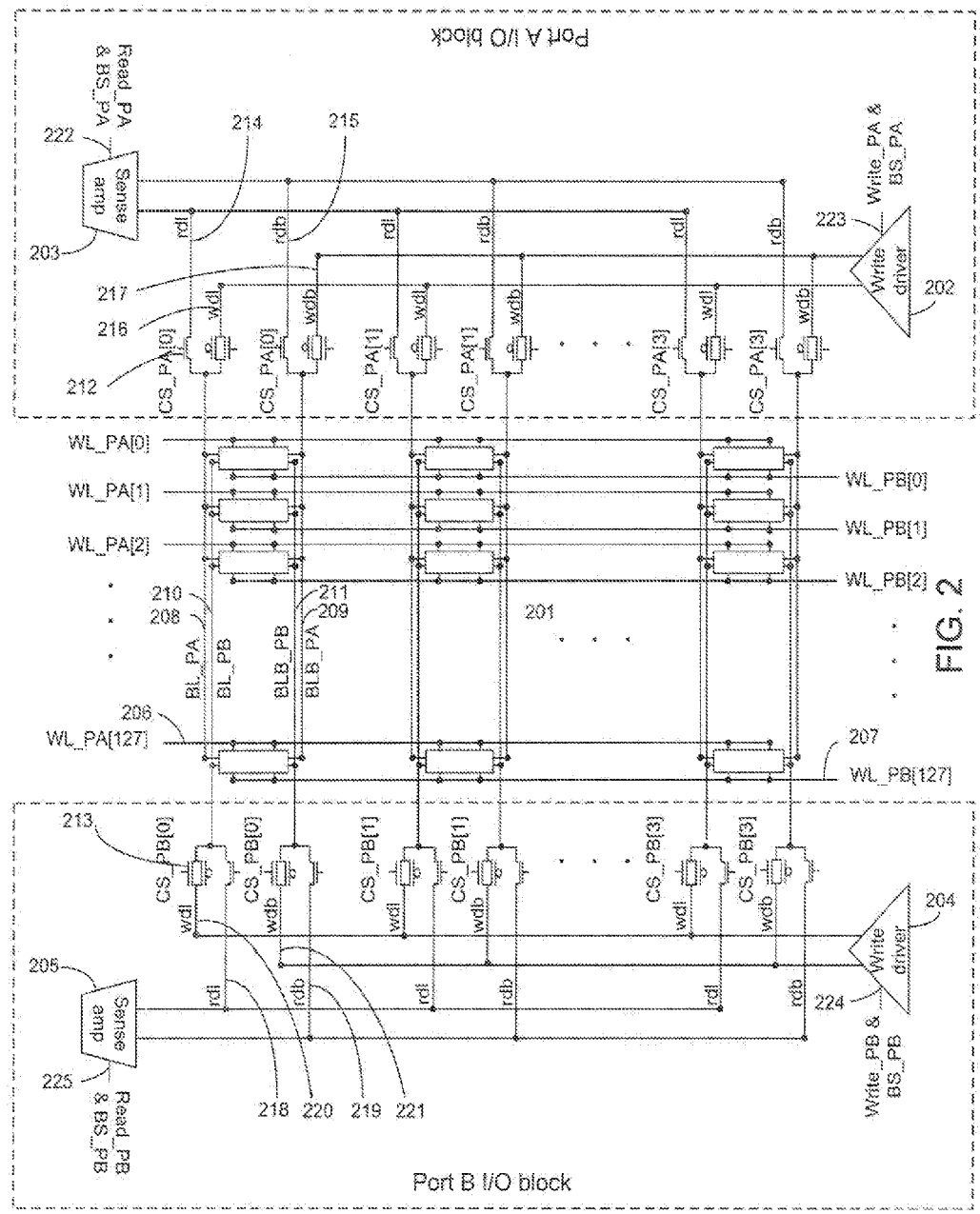
FIG. 2 is a simplified illustration of a true dual-port (2RW) memory system circuitry related to various embodiments of the invention.

FIG. 2 is a simplified illustration of a true dual-port (2RW) memory system circuitry related to embodiments of the present invention. This circuit may include, memory array 201, write drivers 202 and 204, sense amplifiers 203 and 205, wordlines 206 and 207, bitlines 208, 209, 210 and 211, column select passgates 212 and 213, read global bitlines 214, 215, 218 and 719, and write global bitlines 716, 217, 220 and 291. Each of the write drivers 202, 204 may be separately controlled by write enable signals and block select signals. Each of the sense amplifiers may be separately controlled by read enable signals and block select signals.

A true dual-port memory system may have two sets of input signals and output signals. Input signals may include data inputs DI_PA[M:0] and DI_PB[M:0], write enable signals WE_PA and WE_PB, read enable signals RE_PA and RE_PB, clock signals CLK_PA and CLK_PB, and addresses ADR_PA[N:0] and ADR_PB[N:0]; while output signals may include data outputs DO_PA[M:0] and DO_PB[M:0]. These two sets of input signals may be used to support two independent read or write operations. For purposes of clarity, these two independent access ports (including associated input and output signals) will be referred to as Port A and Port B. One set of input control signals may be fed to control logic of Port A, i.e., ADR_PA[N:0] may be used to determine a memory location for Port A operation, while WE_PA and RE_PA may be used to generate. Port A write control signal 223 and Port A read control signal 222. The other set of input control signals may be fed to control logic of Port B, i.e., ADR_PB [N:0] may be used to determine a memory location for Port B operation, while WE_PB and RE_PB may be used to generate Port B write control 224 and Port B read control 225.

Memory array 201 may be any storage circuit, which in this particular example may be built up from eight-transistor dual-port static random access memory (SRAM). A dual-port memory cell may have two unique input and output ports, which may be connected to respective bitline pairs. In this example, the outer pair of bitlines 208 and 209 is shown as being associated with Port A. The inner pair of bitlines 210 and 211 is shown as being associated with Port B. Each of the bitline pairs may be made up of one bitline true signal and one bitline complement signal, which may be connected to sense amplifiers and write drivers. When. Port A write control signal 223 is activated, the DI_PA[M:0] may be written into the memory location specified by ADR_PA[N:0]. When Port A read control signal 222 is activated, the DO_PA[M:0] may be read out from memory location specified by ADR_PA[N:0]. When Port B write control signal 224 is activated, the DI_PB [M:0] may be written into the memory location specified by ADR_PB[N:0]. When Port B read control signal 225 is activated, the DO_PB[M:0] may be read out from memory location specified by ADR_PB[N:0].

A memory array can be partitioned into X number of rows and Y number of columns in each bank. In this particular example, memory array 201 is partitioned into 128 rows and 4 columns in a bank; however, the invention is not thus limited. The row access may be controlled by wordline, where each row may correspond to one wordline. The column access may be controlled by column select passgates, where each column may correspond to one set of column select passgates. In this example, Port A has 128 wordlines WL_PA[127:0] and 4 sets of column select passgates CS_PA[3:0], and similarly, Port B has 128 wordlines WL_PB[127:0] and 4 sets of column select passgates CS_PB[3:0]. Wordline activation may be determined by the lower significant bits of the address, and column select passgate activation may be determined by the higher significant bits of the address (however, the invention is not thus limited). For example, WL_PA[127:0] may be decoded from ADR_PA[6:0], CS_PA[3:0] may be decoded from ADR_PA[8:7], WL_PB[127:0] may be decoded from ADR_PB[6:0], and CS_PB[3:0] may be decoded from ADR_PB[8:7].

Figure 3:
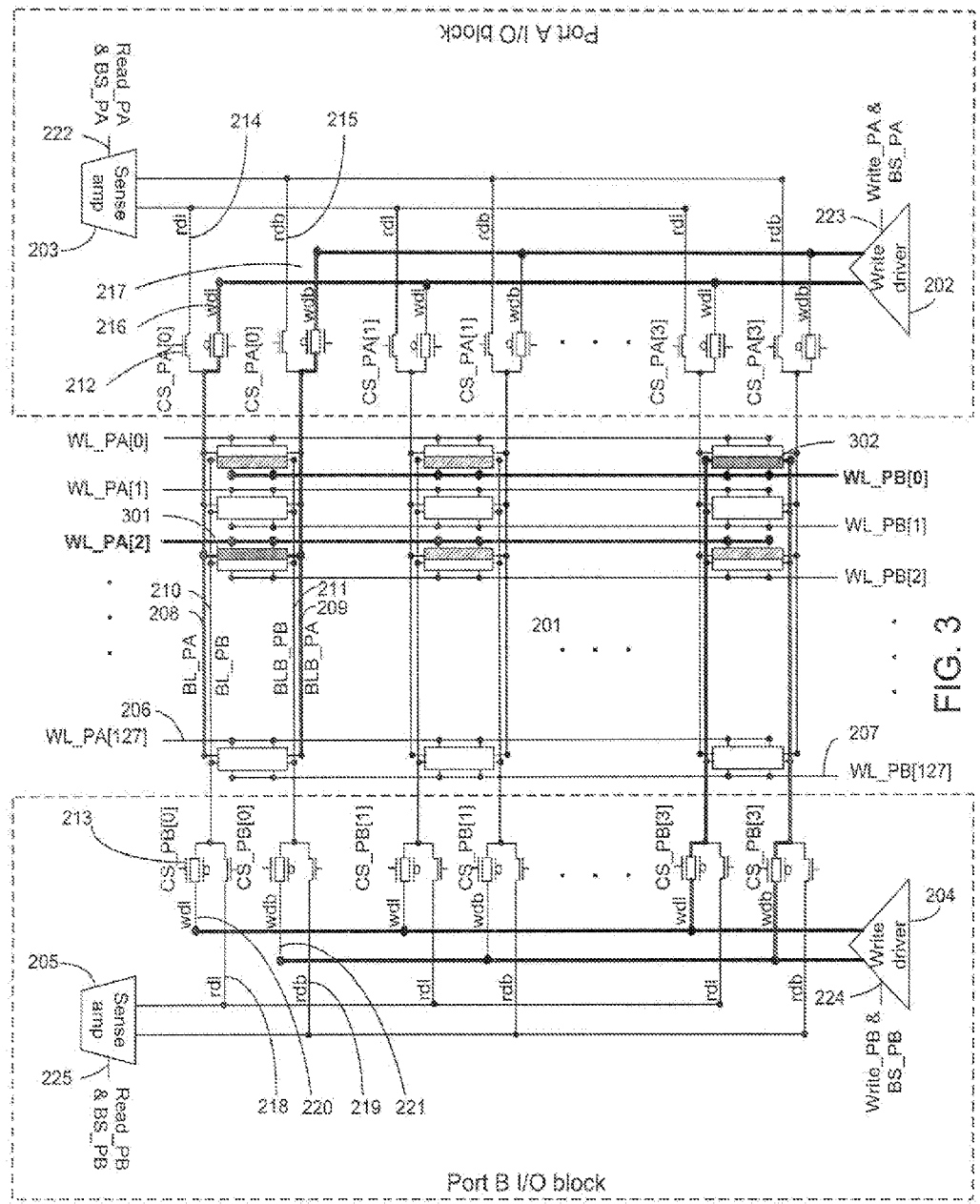
FIG. 3 is a simplified illustration of a simultaneous write (2W) operation with different row access, in a true dual-port memory system, according to various embodiments of the invention.

FIG. 3 is a simplified illustration of a simultaneous write (2W) operation with different row access, in a true dual-port memory system according to an embodiment of the invention. In this particular example, Port A is shown writing to ADR_PA[8:0]=0 0000 0010 (in binary), or address location 2 (in decimal). In such a case, WL_PA[2] and CS_PA[0] may be activated. Input data may then be written into the bitcell 301, which is shaded in dark. The row of the bitcells sharing the same wordline as WL_PA[2] may act as a dummy read operation, since their access transistors may be activated. The bitcells in which such dummy read operations may thus occur are shown highlighted with stripes.

Port B is shown writing to ADR_PB[8:0]=1 1000 0000 (in binary), or address location 348 (in decimal). In such a case, WL_PB[0] and CS_PB[3] may be activated. Input data may be written into the bitcell 302, which is shaded in dark. The row of the bitcells sharing the same wordline as WL_PB[0] may act as a dummy read operation, since their access transistors may be activated. The bitcells in which such dummy read operations may thus occur are shown highlighted with stripes.

Figure 4:
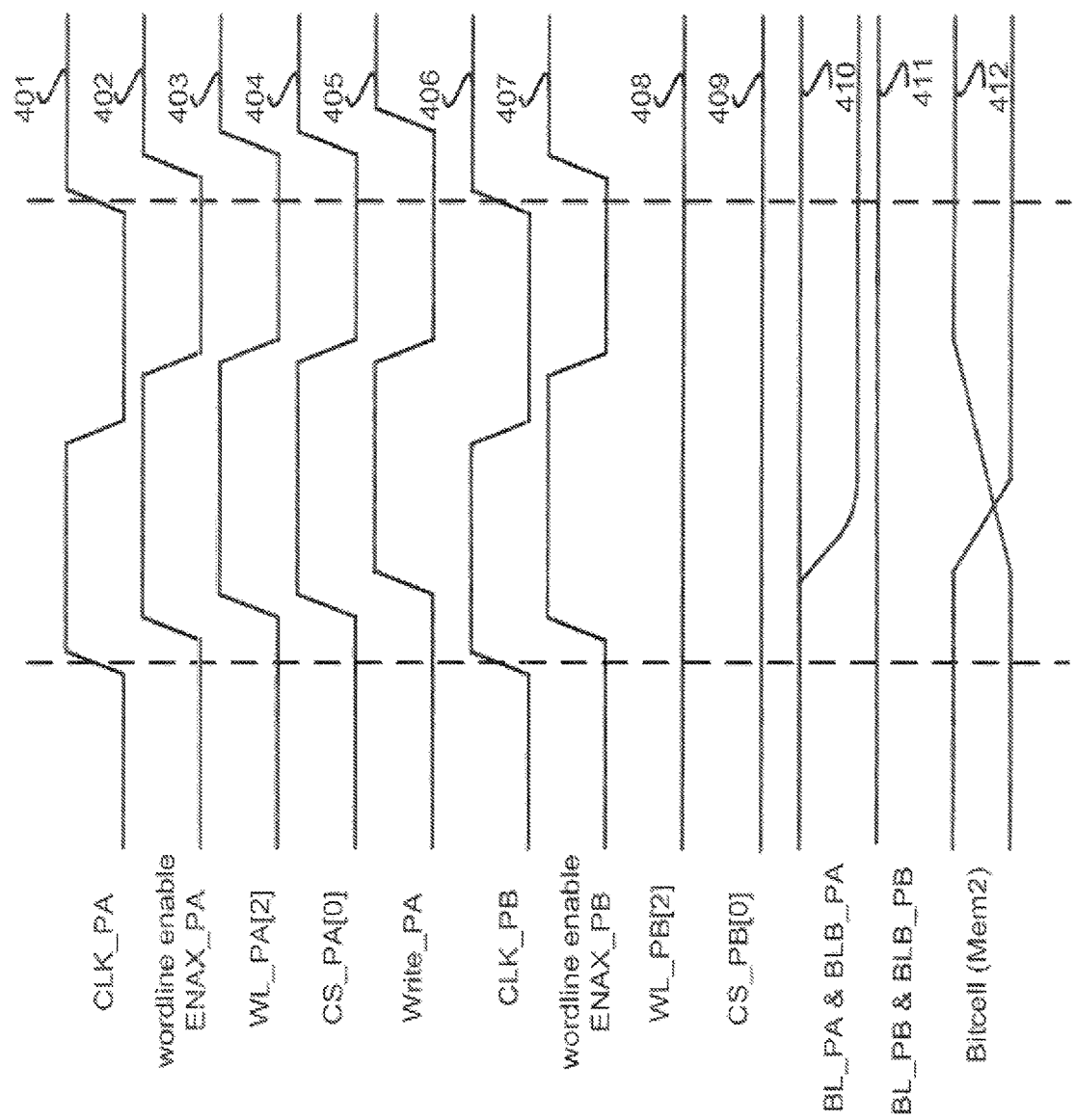
FIG. 4 illustrates waveforms demonstrating the relationships among various signals in accordance with operations described in connection with FIG. 3.

FIG. 4 illustrates waveforms that may demonstrate the relationships among various signals in accordance to the operation described in FIG. 3. These waveforms illustrate the write operation of Port A. FIG. 4 includes waveforms for CLK_PA 401, ENAX_PA 402, WL_PA[2] 403, CS_PA[0] 404, WRITE_PA 405, CLK_PB 406, ENAX_PB 407, WL_PB[2] 408, CS_PB[0] 409, BL_PA and BLB_PB 410, BL_PB and BLB_PB 411 and bitcell(Mem2) 412. WRITE_PA 405 corresponds to Port A write control signal 223, BL_PA and BLB_PA 410 correspond to bitlines 208 and 209, respectively. BL_PB and BLB_PB 411 correspond to bitlines 210 and 211, respectively. Bitcell(Mem2) 412 corresponds to bitcell 301.

When Port A and Port B are both doing a write operation to different addresses, both wordline enable signals 402 and 407 may be generated after a certain delay from their respective clocks, 401 and 406. Next, wordlines 403 and 408 and column selects 404 and 409 may be activated accordingly. In this example, to which the invention is not limited, only WL_PA [2] and CS_PA[0] will be activated, while WL_PB[2] and CS_PB[0] will not be activated. When WRITE_PA 405 is activated, input data may be fed through BL_PA and BLB_PA 410 and may be written into bitcell(Mem2) 412. As WL_PB [2] 408 will not be activated in this non-limiting example, BL_PB and BLB_PB 411 will stay at a precharged level, which may be, e.g., at VDD (power supply). There is no disturbance to the write operation, and hence bitcell(Mem2) 412 can be flipped easily and written successfully.

Figure 5:
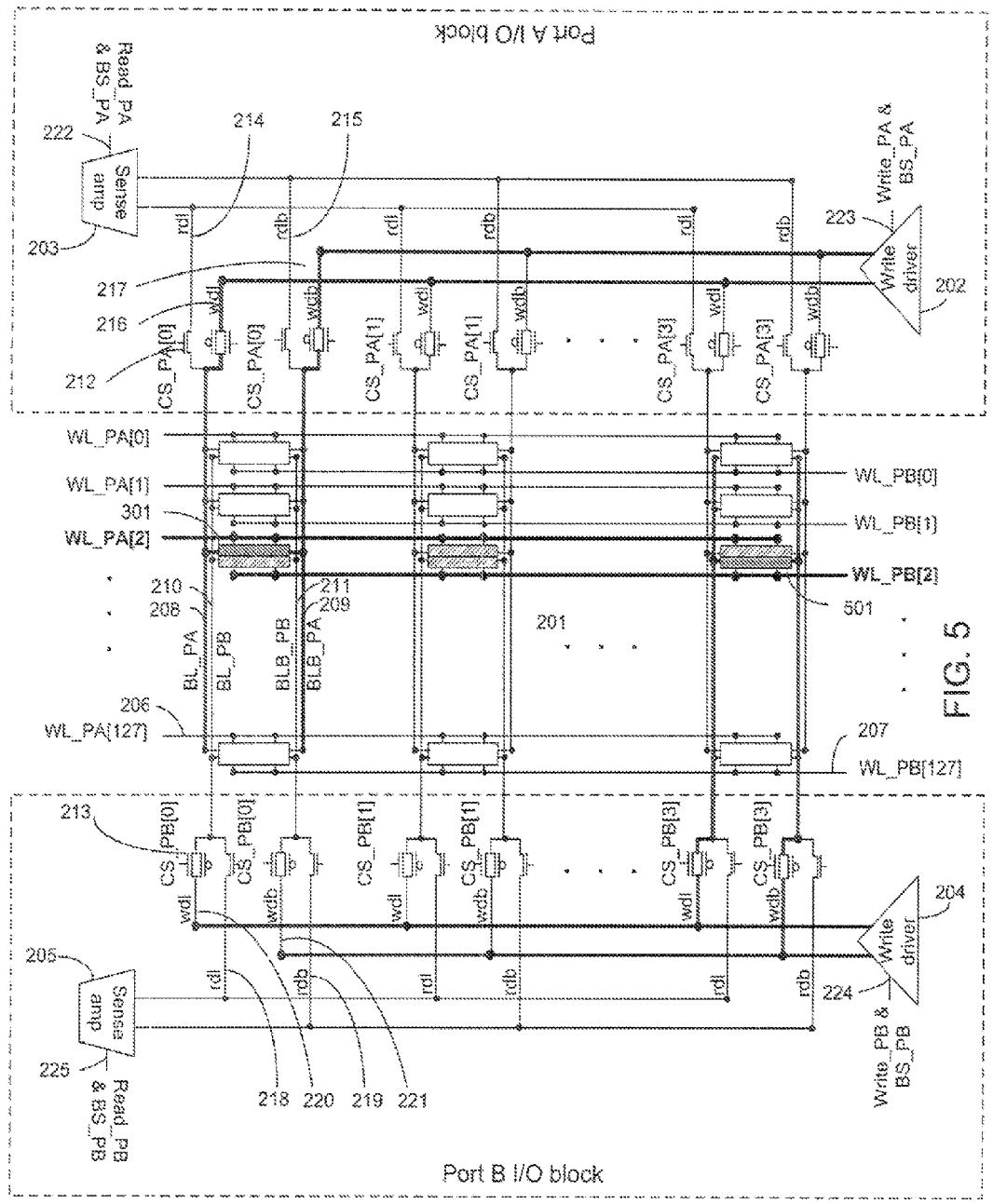
FIG. 5 is a simplified illustration of a simultaneous write (2W) Operation with same row, different column access, in a dual-port memory system, according to various embodiments of the invention.

FIG. 5 is a simplified illustration of a simultaneous write (2W) operation at same row, different column access, in a dual-port memory system, according to an embodiment of the invention. Simultaneous access to the same row may also be called, "row contention." In this particular example, to which the invention is not limited, Port A may write to ADR_PA[8:0]=0 0000 0010 (in binary), or address location 2 (in decimal). WL_PA[2] and CS_PA[0] may be activated. Write data may be written into the bitcell 301, which is shaded in dark. The row of the bitcells sharing the same wordline as WL_PA[2] may be subject to a dummy read operation, since their access transistors be activated. The bitcells which may be involved in the dummy read operation are highlighted with stripes.

Port B may write to ADR_PB[8:0]=1 1000 0010 (in binary), or address location 898 (in decimal). WL_PB[2] CS_PB[3] may be activated. Input data may be written into the bitcell 501, which is shaded in dark. The row of the bitcells sharing the same wordline as WL_PB[2] may be subject to a dummy read operation since their access transistors may be activated. The bitcells which may be involved in the dummy read operation are highlighted with stripes.

Figure 6:
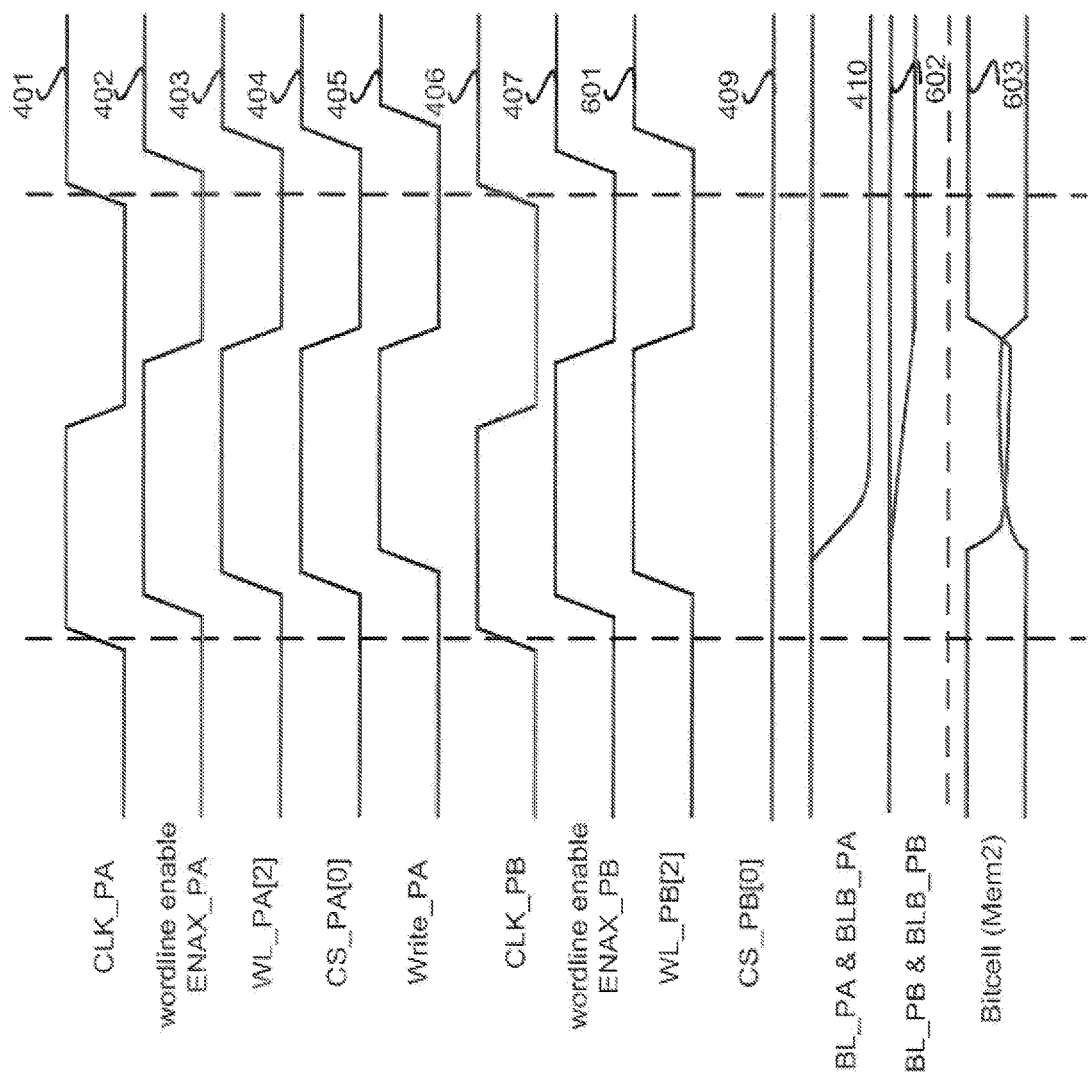
FIG. 6 illustrates waveforms demonstrating the relationships among various signals in accordance with operations described in connection with FIG. 5.

FIG. 6 illustrates waveforms that may demonstrate the relationships among various signals in accordance to the operation described in FIG. 5. These waveforms may correspond to the write operation of Port A. FIG. 6 includes waveforms for CLK_PA 401, ENAX_PA 402, WL_PA[2] 403, CS_PA[0] 404, WRITE_PA 405, CLK_PB 406, ENAX_PB 407, WL_PB[2] 601, CS_PB[0] 409, BL_PA and BLB_PB 410, BL_PB and BLB_PB 602 and bitcell(Mem2) 603. WRITE_PA 405 may correspond to Port A write control signal 223. BL_PA and BLB_PA 410 may correspond to bitlines 208 and 209, respectively. BL_PB and BL_PB 602 may correspond to bitlines 210 and 211 respectively. Bitcell (Mem2) 603 may correspond to bitcell 301.

When Part A and Port B are both doing a write operation at the same row, but different columns, both wordline enable signals 402 and 407 may be generated after a certain delay from their respective clocks 401 and 406. Next, wordlines 403 and 601 and column selects 404 and 409 may be activated accordingly. In this example, to which the invention is not limited, WL_PA[2], CS_PA[0] and WL_PB[2] may be activated, while CS_PB[0] may not be activated. When WRITE_PA 405 is activated, input, data may be fed through BL_PA and BLB_PA 410. At bitcell 301, all four access transistors may be activated. Two Port A access transistors may be activated for write operation, while two Port B access transistors may be activated and may perform a dummy read operation. The dummy read operation may cause the BL_PB and BLB_PB 602 to start discharging accordingly. Disturbance from BL_PB and BLB_PB 602 may cause bitcell (Mem2) 603 to be unable to be flipped in time. The storage node may thus retain the original data after WL_PA[2] 403 is deactivated, resulting in a write failure.

Figure 7:
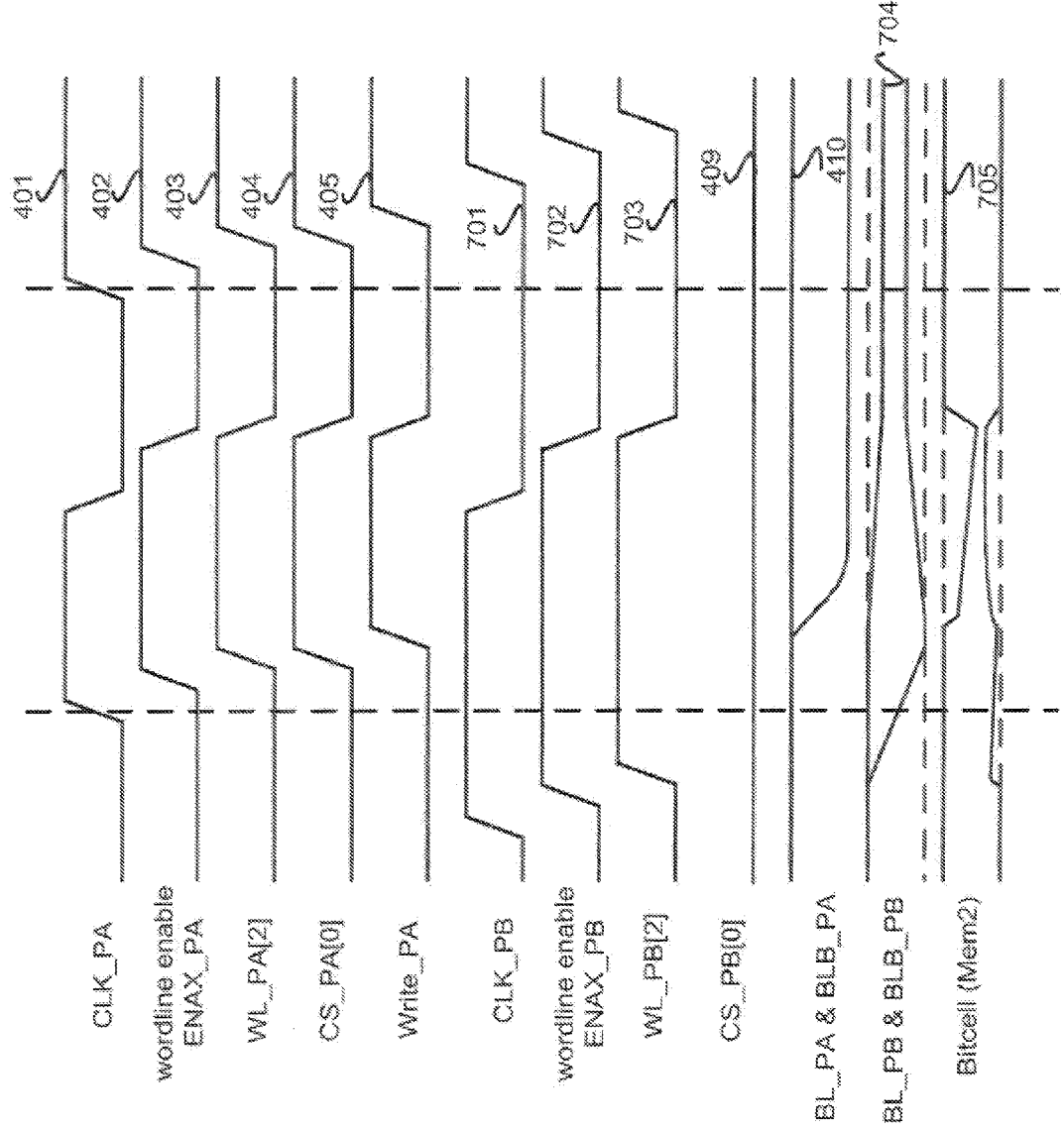
FIG. 7 illustrates waveforms demonstrating the relationships among various signals in accordance with operations described in connection with FIG. 5, with asynchronous clock operation.

FIG. 7 illustrates waveforms demonstrating the relationships among various signals in accordance with the operation described in FIG. 5, in an asynchronous clock operation. These waveforms may illustrate the write operation of Port A. FIG. 7 includes waveforms for CLK_PA 401, ENAX_PA 402, WL_PA[2] 403, CS_PA[0] 404, WRITE_PA 405, CLK_PB 701, ENAX_PB 702, WL_PB[2] 703, CS_PB[0] 409, BL_PA and BLB_PB 410, BL_PB and BLB_PB 704 and bitcell(Mem2) 705. WRITE_PA 405 may correspond to Port A write control signal 223. BL_PA and BLB_PA 410 may correspond to bitlines 208 and 209, respectively. BL_PB and BLB_PB 704 may correspond to bitlines 210 and 211, respectively. Bitcell(Mem2) 705 may correspond to bitcell 301.

In this particular case, to which the invention is not limited, Port B may be running at a lower clock frequency than Port A, and hence CLK_PB 701 may have a longer period. Port B operation may thus lead that of Port A operation, and hence ENAX_PB 703 and WL_PB[2] 704 may be activated earlier than ENAX_PA 402 and WL_PA[2] 403. After WL_PB[2] is activated, BL_PB and BLB_PB 704 may start discharging accordingly, due to the dummy read operation. One of the bitlines may be discharged, e.g., to VSS, before WRITE_PA 405 is activated. When WRITE_PA 405 is activated, input data may be fed through BL_PA and BLB_PA 410. Disturbance from BL_PB and BLB_PB 704 may cause bitcell (Mem2) 705 to be unable to be flipped in time. The storage node may thus retain the original data after WL_PA[2] 403 is deactivated, resulting in as write failure.

Figure 8:
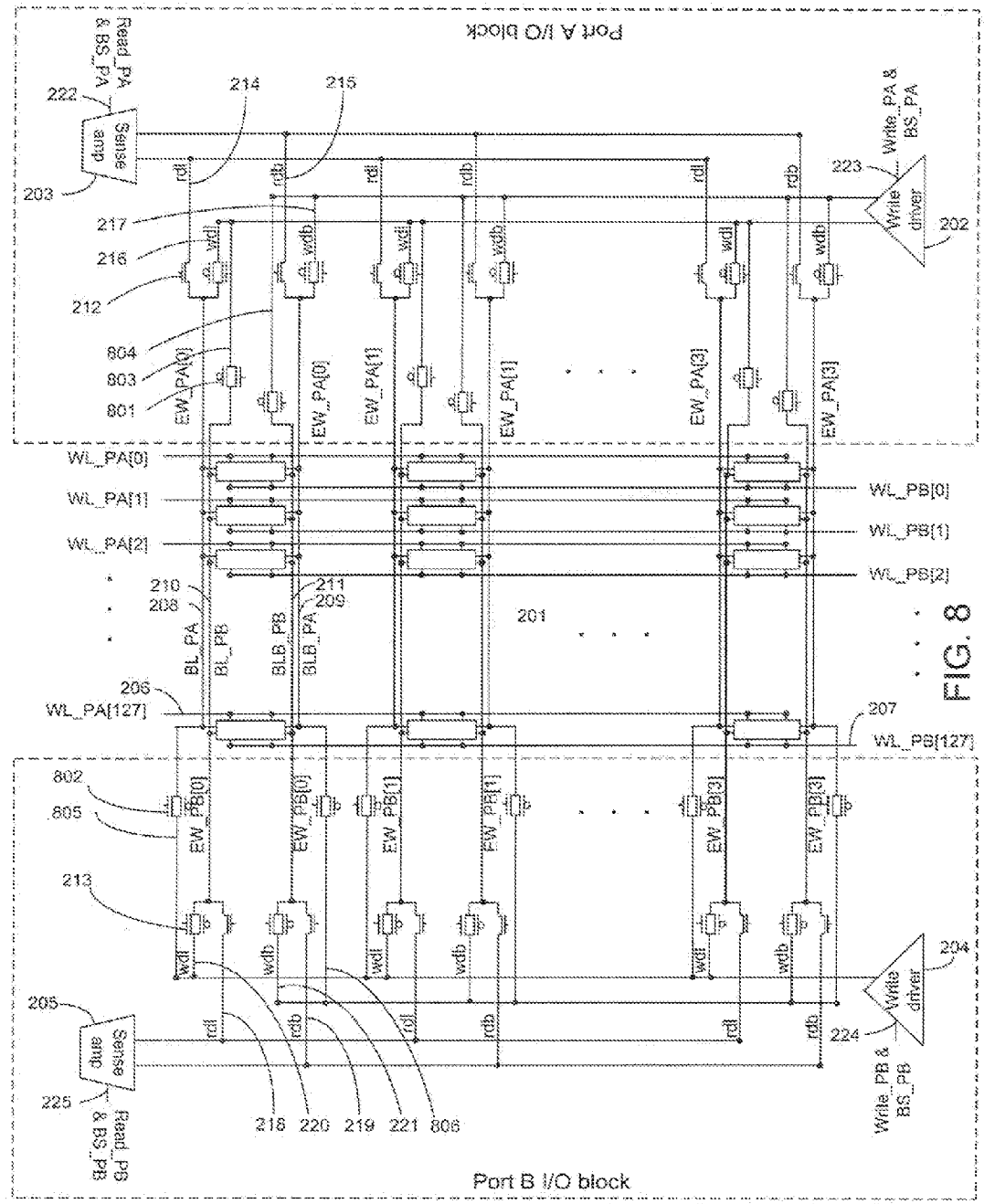
FIG. 8 is a simplified illustration of an improved true dual-port (2RW) memory system circuitry, in accordance with various embodiments of the present invention.

FIG. 8 is a simplified illustration of an improved true dual-port (2RW) memory system circuitry, in accordance with various embodiments of the present invention. Two sets of extra column select passgates may be introduced, namely, EW_PA[3:0] 801 and EW_PB[3:0] 802. These extra column select passgates may allow a double write, e.g., writing to both set of bitlines, in the case of row contention. Port A write global bitlines 803 and 804 may be shorted to 216 and 217, respectively. Port B write global bitlines 805 and 806 may be shorted to 220 and 221 respectively.

Figure 9:
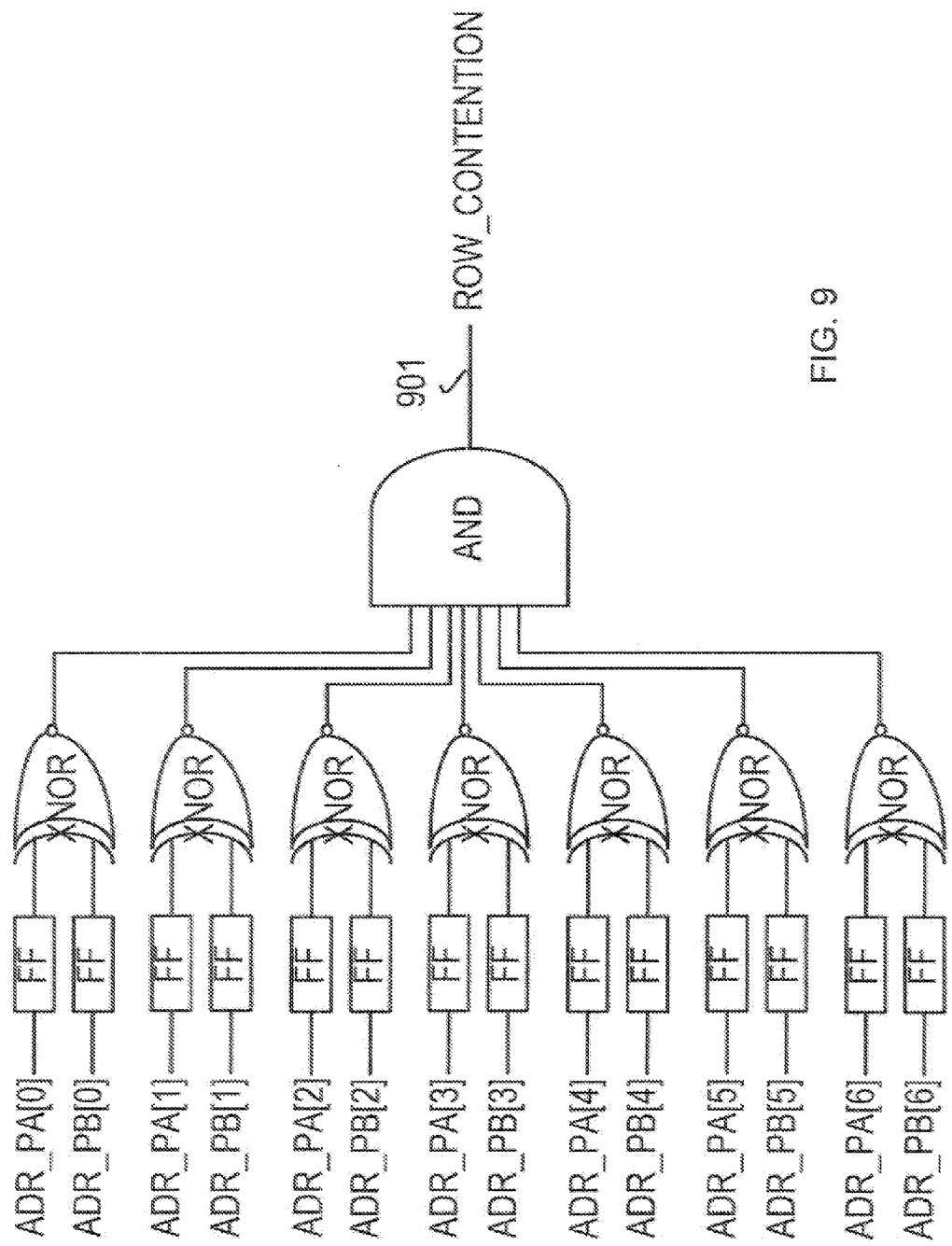
FIG. 9 is a simplified illustration of an example of an address comparator that may be used in various embodiments of the invention.

FIG. 9 is a simplified illustration of an example of an address comparator. ROW_CONTENTION signal 901 may be activated if flopped ADR_PA[6:0] matches flopped ADR_PB[6:0], ROW_CONTENTION signal 901 may be a level sensitive signal.

Figure 10:
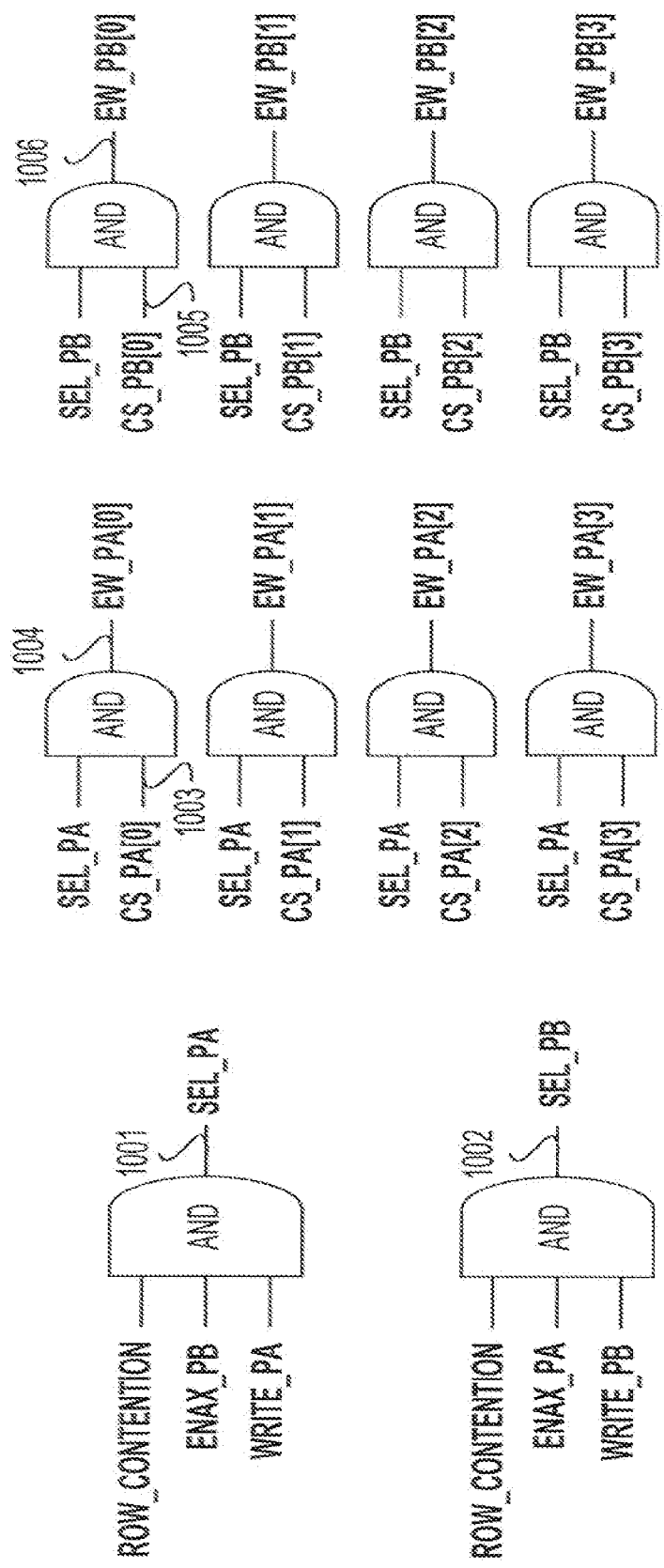
FIG. 10 is a simplified illustration of double write control signal generation circuitry according to an embodiment of the present invention.

FIG. 10 is a simplified illustration of the double write control signal generation circuitry according to an embodiment of the present invention. SEL_PA 1001 may be used to determine if Port A requires a double write operation. SEL_PA 1001 may be generated when ROW_CONTENTION, ENAX_PB and WRITE_PA are all active high. CS_PA[3:0] 1003 may correspond to the Port A column select 212. EW_PA[3:0] 1004 may correspond to the Port A extra column select 801. SEL_PA 1001 may be ANDed with CS_PA[3:0] 1003 to generate EW_PA[3:0] 1004, which may be used to control the passgate of the Port A extra column select 801.

SEL_PB 1002 may be used to determine if Port B requires a double write operation. SEL_PB 1002 may be generated when ROW_CONTENTION, ENAX_PA and WRITE_PB are all active high. CS_PB[3:0] 1005 may correspond to the Port B column select 213. EW_PB[3:0] 1006 may correspond to the Port B extra column select 802. SEL_PB 1002 may be ANDed with CS_PB[3:0] 1005 to generate EW_PB[3:0] 1006, which may be used to control the passgate the Port B extra column select 802.

Figure 11:
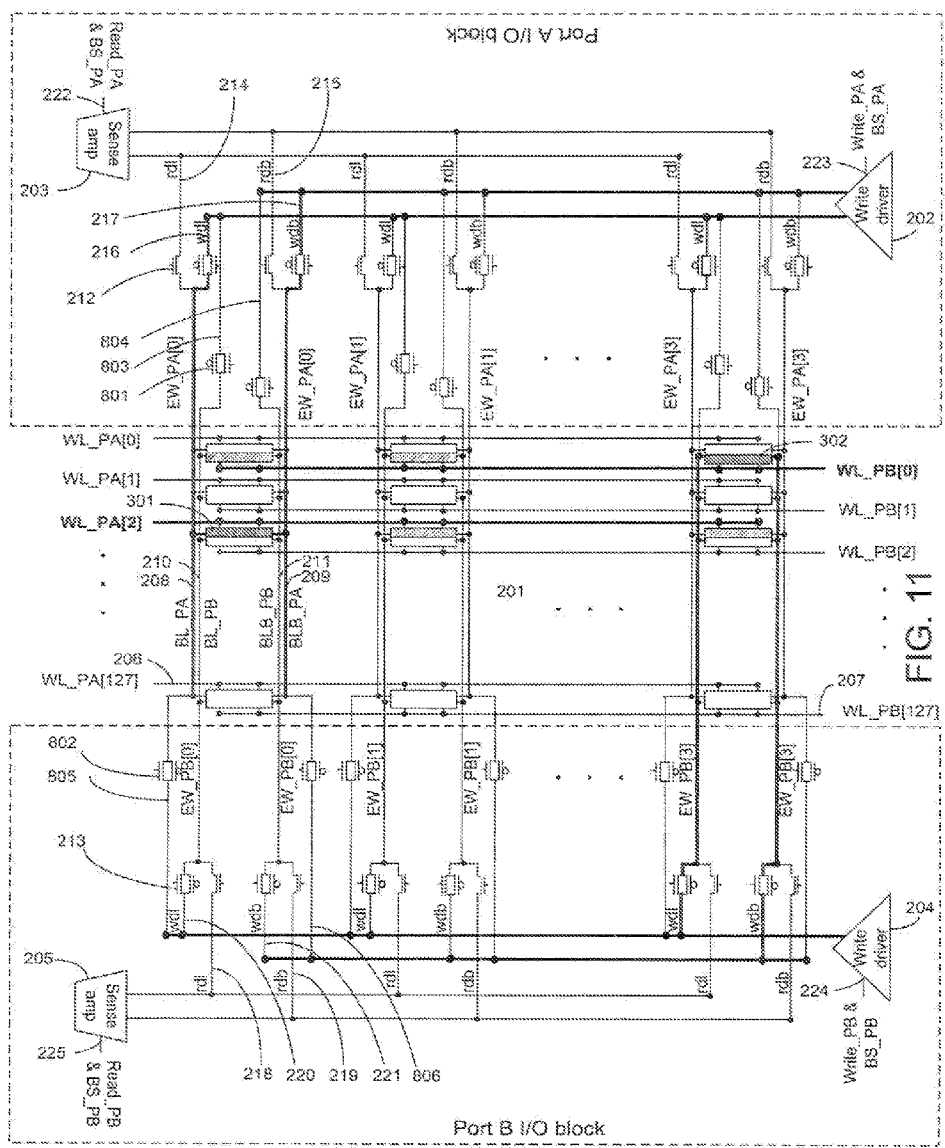
FIG. 11 is a simplified illustration of a simultaneous write (2W) operation with different row access, in an improved true dual-port memory system, in accordance with embodiments of the present invention.

FIG. 11 is a simplified illustration of a simultaneous write (2W) operation at different row access, in an improved true dual-port memory system in accordance with embodiments of the present invention. The operation of this example is similar to the operation described in FIG. 3. Port A may write to ADR_PA[8:0]=0 0000 0010 (in binary), or address location 2 (in decimal). WL_PA[2] and CS_PA[0] may be activated. Input data may be written into the bitcell 301, which is shaded in dark. The row of the bitcells sharing the same wordline as WL_PA[2] may be subject to a dummy read operation, since their access transistors may be activated. The bitcells that may be involved in such a dummy read operation are shown highlighted with stripes.

Port B may write to ADR_PB[8:0]=1 1000 0000 (in binary), or address location 384 (in decimal). WL_PB[0] and CS_PB[3] may be activated. Input data may be written into the bitcell 302, which is shaded in dark. The row of the bitcells sharing the some wordline as WL_PB[0] may be subject to a dummy read operation, since their access transistors may be activated. The bitcells that may be subject to such a dummy read operation are highlighted with stripes.

Figure 12:
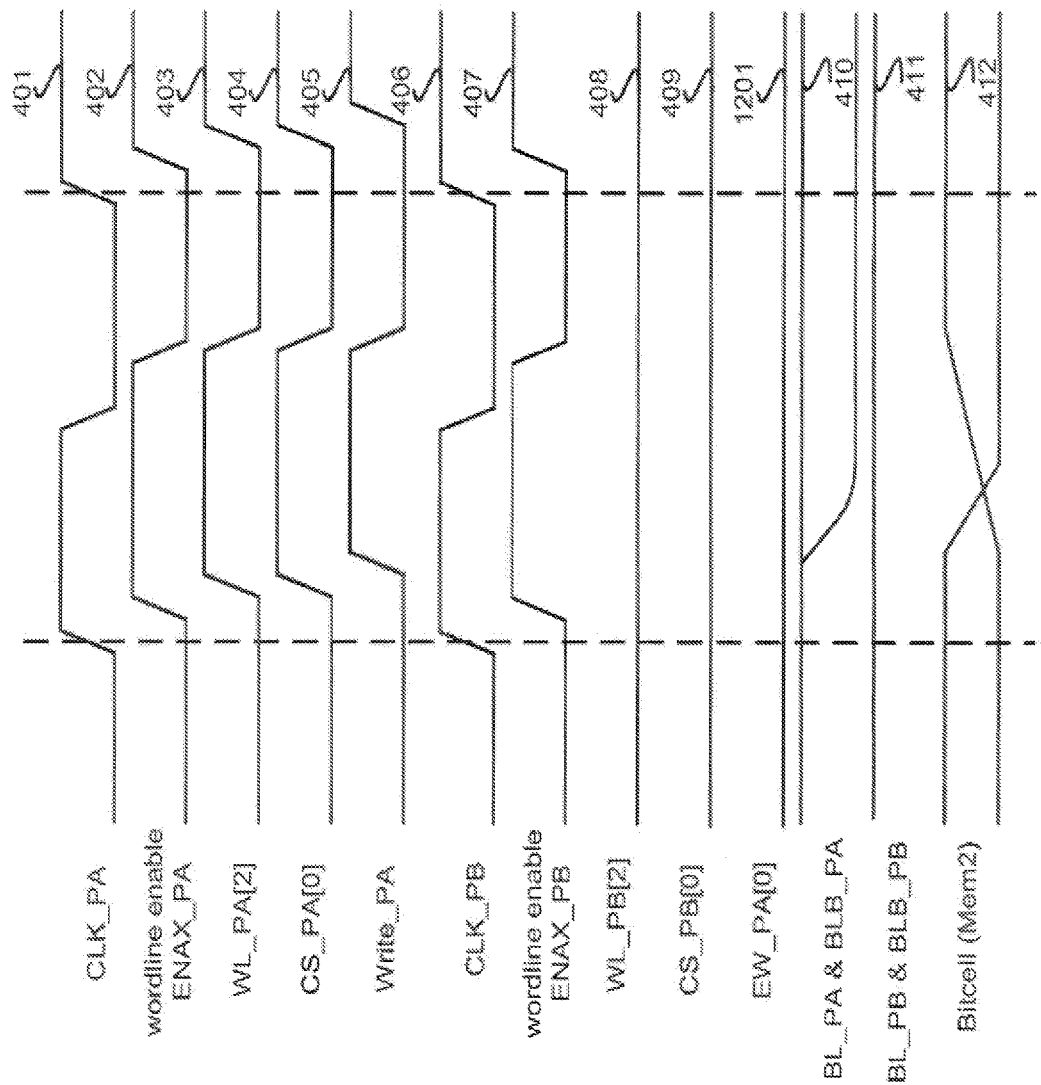
FIG. 12 illustrates waveforms demonstrating various relationships among various signals in accordance with operations described in connection with FIG. 11.

FIG. 12 illustrates waveforms that may demonstrate relationships among various signals in accordance to the operations described in FIG. 11. These waveforms may be used to illustrate the write operation of Port A. FIG. 12 is similar to FIG. 4 except for EW_PA[0] 1201, which corresponds to extra column select passgate signals 801. In this example, since flopped ADR_PA[6:0] is not equal to flopped ADR_PB [6:0] the ROW_CONTENTION signal 901 will not be activated, and hence extra column select passgates EW_PA[0] 1201 will not be activated (but the invention is not limited to this example).

When Port A and Port B are both attempting write operations to different addresses, both wordline enable signals 402 and 407 may be generated after a certain delay from their respective clocks 401 and 406. Next, wordlines 403 and 408 and column select signals 404 and 409 may be activated accordingly. In this example, WL_PA[2] and CS_PA[0] are shown as being activated, while WL_PB[2] and CS_PB[0] are shown as not being activated. When WRITE_PA 405 is activated, input data may be fed through BL_PA and BLB_PA 410 and may be written into bitcell(Mem2) 412. As WL_PB [2] 408 may not be activated, BL_PB and BLB_PB 411 may stay, e.g., at a precharged level, which may be VDD (power supply voltage). Accordingly, there may be no disturbance to the write operation and bitcell(Mem2) 412 may be flipped and written successfully.

Figure 13:
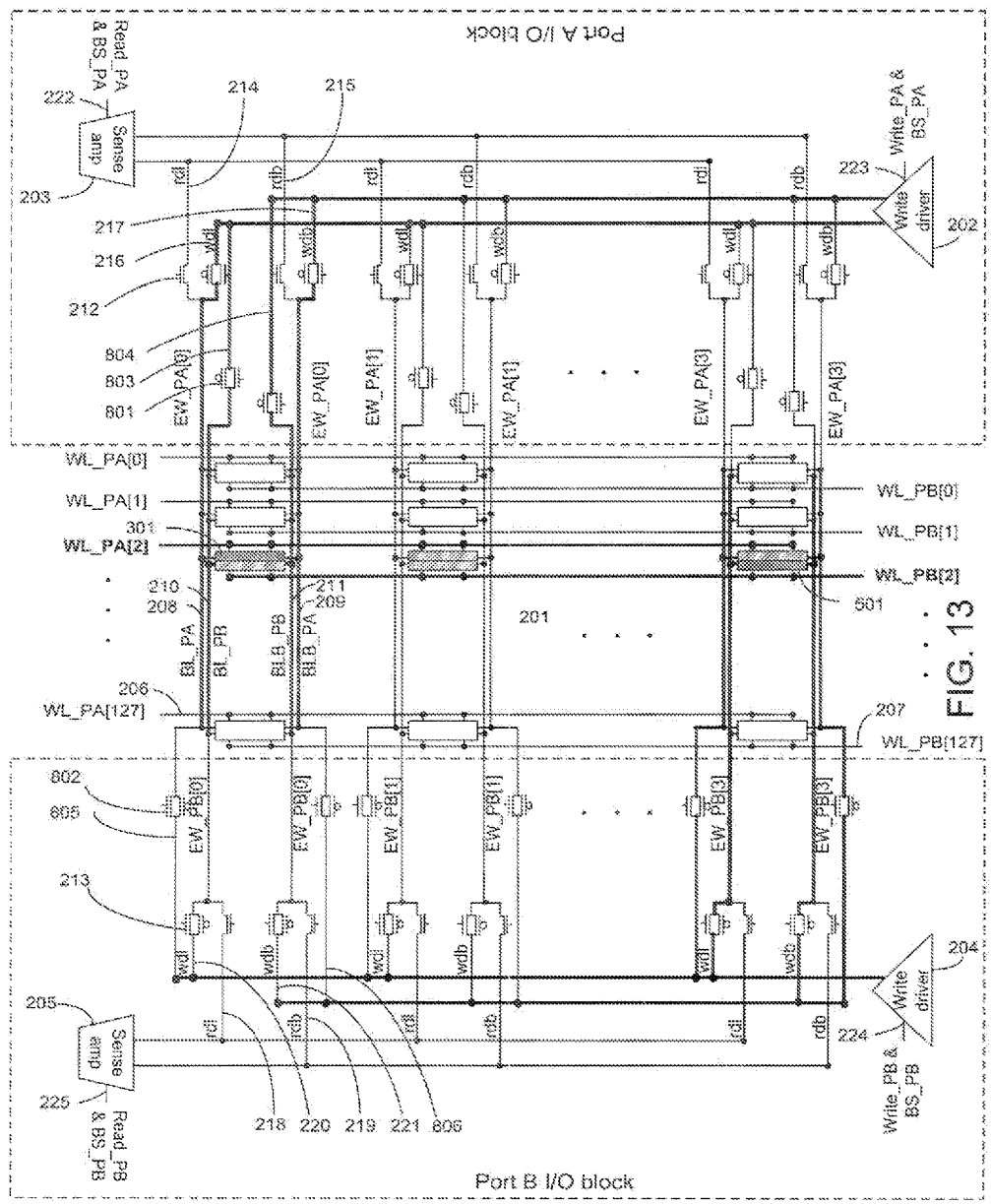
FIG. 13 is a simplified illustration eta simultaneous write (2W) operation with same row, different column access, in an improved true dual-port memory system, in accordance with embodiments of the present invention.

FIG. 13 is a simplified illustration of a simultaneous write (2W) operation at same row, different column access, in an improved true dual-port memory system, in accordance with embodiments of the present invention. Simultaneous access to the same row is also known as row contention. The operation of this example may be similar to the operation described in FIG. 5. Port A may attempt to write to ADR_PA[8:0]=0 0000 0010 (in binary), or address location 2 (in decimal). WL_PA[2] and CS_PA[0] may be activated. Input data may be written into the bitcell 301, which is shown shaded in dark. The row of the bitcells sharing the same wordline as WL_PA [2] may be subject to a dummy read operation, since their access transistors may be activated. The bitcells that may be subject to a dummy read operation are shown highlighted with stripes.

Port B may attempt to write to ADR_PB[8:0]=1 1000 0010 (in binary), or address location 386 (in decimal). WL_PB[2] and CS_PB[3] may be activated. Input data may be written into the bitcell 501, which is shown shaded in dark. The row of the bitcells sharing the same wordline as WL_PB[2] may be subject to a dummy read operation, since their access transistors may be activated. The bitcells that may be subject to a dummy read operation are shown highlighted with stripes.

Figure 14:
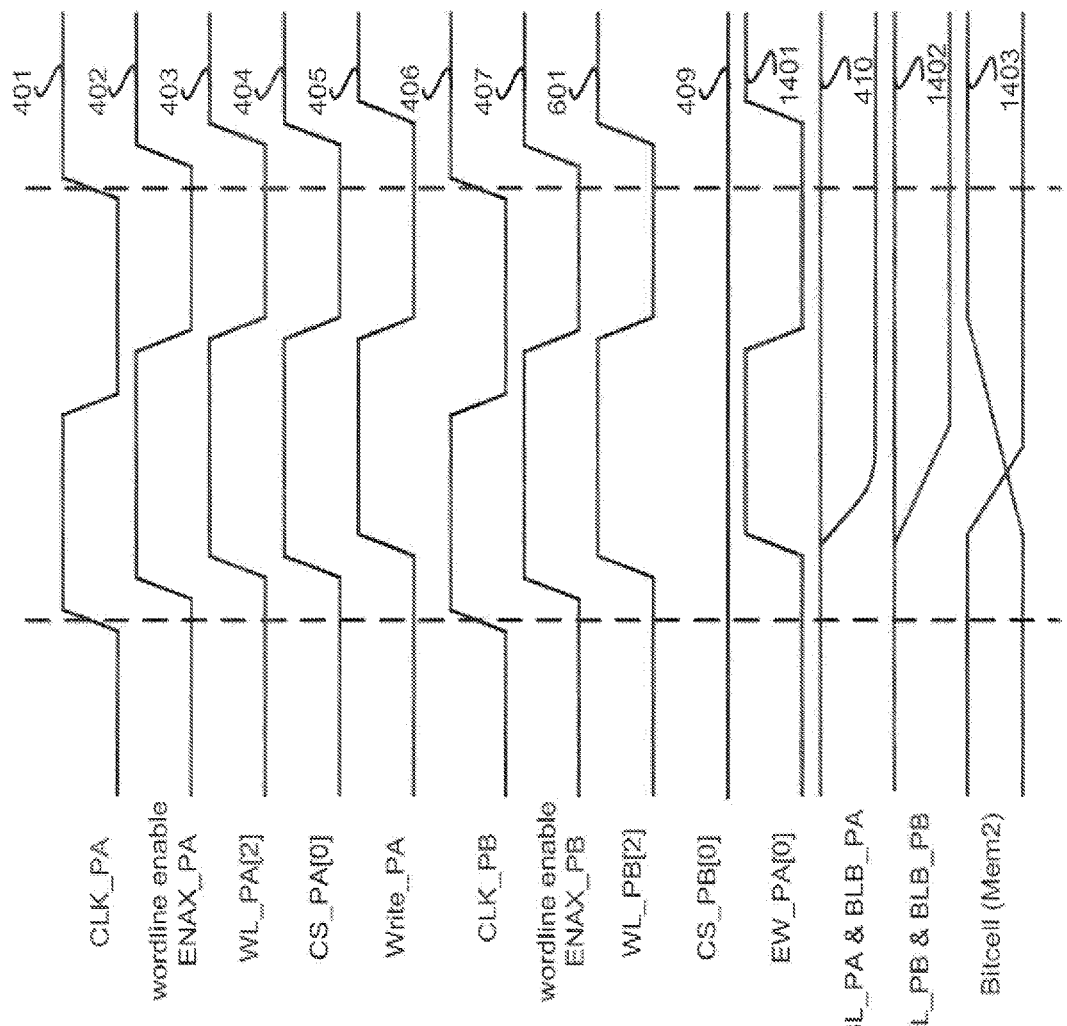
FIG. 14 illustrates waveforms demonstrating the relationships among various signals in accordance with operations described in connection with FIG. 13.

FIG. 14 illustrates waveforms that may be used to illustrate relationships among various signals in accordance with the operation described in FIG. 13. These waveforms may be used to illustrate the write operation of Port A. EW_PA[0] 1401 may correspond to extra column select passgate signals 801. BL_PB and BLB_PB 1402 may correspond to bitlines 210 and 211, respectively. Bitcell(Mem2) 1403 may correspond to bitcell 301.

In this example, to which the invention is not limited, since flopped ADR_PA[6:0] matches flopped ADR_PB[6:0] the ROW_CONTENTION signal 901 ma be activated. SEL_PA 1001 may be generated when ROW_CONTENTION, ENAX_PB and WRITE_PA are all active high, as discussed in conjunction with FIG. 10. Subsequently, EW_PA[0] may be activated if both SEL_PA 1001 and CS_PA[0] are active high. When EW_PA[0] is activated, write driver 202 may drive the input data through bitline BL_PB 210 and BLB_PB 211, as well.

When Port A and Port B are both attempting a write operation, at the same row but different columns, both wordline enable signals 402 and 407 may be generated after a certain delay from their respective clocks 401 and 406. Next, wordlines 403 and 601 and column selects 404 and 409 may be activated accordingly. In this example, WL_PA[2], CS_PA[0] and WL_PB[2] may be activated, while CS_PB[0] may not be activated. When WRITE_PA 405 is activated, input data may be fed through BL_PA and BLB_PA 410. At bitcell 301, all four access transistors may consequently be activated. As mentioned earlier, when EW_PA[0] is activated, write driver 202 may drive the input data through bitline BL_PB and BLB_PB 1402, as well. Hence, all four access transistors of bitcell 301 may be activated for write operation. Consequently, the bitcell(Mem2) 1403 may be flipped and written successfully.

FIG. 15 illustrates waveforms that may demonstrate relationships among various signals in accordance with the operation described in FIG. 13, in an asynchronous clock operation. These waveforms may illustrate the write operation of Port A. EW_PA[0] 1501 may correspond to extra column select passgate signals 801. BL_PB and BLB_PB 1502 may correspond to bitlines 210 and 211, respectively. Bitcell(Mem2) 1503 may correspond to bitcell 301.

In this particular case, to which the invention is not limited, Port B may be running at a lower frequency compared to Port A; hence, CLK_PB 701 is shown having a longer period. Port B operation may lead that of Port A, and hence, ENAX_PB 702 and WL_PB[2] 703 may be activated earlier than ENAX_PA 402 and WL_PA[2] 403. After WL_PB[2] is activated, BL_PB and BLB_PB 1502 may start discharging, accordingly, due to the dummy read operation described above. One of the bitlines may have been discharged to VSS before WRITE_PA 405 is activated. When WRITE_PA 405 is activated, data input may be fed through BL_PA and BLB_PA 410.

ADR_PA[8:0] may be flopped after CLK_PA 401 is toggled high. At this point in time, flopped ADR_PA[6:0] may match flopped ADR_PB[6:0], and the ROW_CONTENTION signal 901 may then be activated. Subsequently, SEL_PA 1001 may be generated when ROW_CONTENTION, ENAX_PB and WRITE_PA are ail active high. EW_PA[0] may be activated when both SEL_PA 1001 and CS_PA[0] are active high. When EW_PA[0] is activated, write driver 202 may drive the input data through bitline BL_PB and BLB_PB 1502, as well. Consequently, the bitcell (Mem2) 1503 can be flipped and written successfully.

Various embodiments of the invention have now been discussed in detail; however, the invention should not be understood as being limited to these embodiments. It should also be appreciated that various modifications, adaptations, and alternative embodiments thereof may be made within the scope and spirit of the present invention.

What is claimed is:

1. A semiconductor memory, comprising:
    a first set of bit line pairs, wherein a respective bit line pair of the first set of bit line pairs is connected to one or more respective first ports of one or more respective multi-port memory cells;
    a second set of bit line pairs, wherein a respective bit line pair of the second set of bit line pairs is connected to respective second ports of one or more respective one of the multi-port memory cells; and at least one pair of switch components, wherein each switch component in the pair of switch components is configured to connect a wire from the first set of bit line pairs to a wire from the second set of bit line pairs, wherein the wire from the first set of bit line pairs and the wire from the second set of bit line pairs are both connected to a same one or more multi-port memory cells of the multi-port memory cells.

2. The semiconductor memory as in claim 1, wherein the switch components are transmission gates.

3. The semiconductor memory as in claim 1, wherein the switch components are pass transistors.

4. The semiconductor memory as in claim 1, further comprising an address comparator, wherein one or more of the switch components are enabled by the address comparator.

5. The semiconductor memory as in claim 1, further comprising:
   at least a third set of bit line pairs; and
   at least one further pair of switch components, wherein each switch component of the at least one further pair of switch components is configured to connect a wire from the at least a third set of bit line pairs to a wire from a different set of bit line pairs.

6. A semiconductor memory comprising:
   a first access port comprising a first set of bit line pairs;
   a second access port comprising a second set of bit line pairs; and
   a conflict detector,
   wherein said first access port is configured to drive lines among the first set of bit line pairs and said second access port is configured to drive lines among the second set of bit line pairs, and
   wherein said first access port is further configured to drive one or more lines among the second set of bit line pairs if a conflict is detected by the conflict detector.

7. The semiconductor memory as in claim 6, wherein the conflict detector is configured to compare portions of address inputs associated with the first access port and the second access port.

8. The semiconductor memory as in claim 6, further comprising:
   a third access port comprising a third set of bitline pairs, wherein the third access port is configured to drive lines among the third set of bitline pairs, and wherein the third access port is further configured to drive one or more lines among the first set of bitline pairs or the second set of bitline pairs if a conflict is detected by the conflict detector.

9. The semiconductor memory as in claim 8, wherein the conflict detector is configured to compare portions of address inputs associated with the first access port, the second access port, and/or the third access port.

10. A method for writing a semiconductor memory comprising two or more ports, wherein each port includes an address input and a data input port, and at least one memory array, the method comprising:
    comparing addresses defined by the address inputs to determine if different ports are accessing one or more memory locations of a same word in the memory array; and
    if the different ports are accessing one or more memory locations of the same word in the memory array, driving the same data onto the data input ports of the different ports accessing the same word of the memory array.

11. The method as in claim 10, wherein driving the same data onto the data input ports of the different ports comprises forming one or more electrical connections between corresponding elements of the data input ports of the different ports to enable the data input ports of the different ports to write the same data to the one or more memory locations of the same word.

12. The method as in claim 11, wherein forming one or more electrical connections comprises selectively enabling a circuit element to provide the connection.

13. The method as in claim 12, wherein selectively enabling comprises:
    determining at a particular port if the port is attempting to write to a memory location in the same word of the memory array in which at least one other port is attempting to write to a memory location; and
    enabling the circuit element to provide the connection, wherein the circuit element corresponds to the memory location to which the particular port is attempting to write.

* * * * *